United States Patent [19]
Midya et al.

[11] Patent Number: 5,838,210
[45] Date of Patent: Nov. 17, 1998

[54] METHOD AND APPARATUS FOR GENERATING A MODULATED SIGNAL

[75] Inventors: Pallab Midya, Schaumburg, Ill.; Robert Michael Jackson, Gilbert, Ariz.; Dale Anderson, Ft. Worth, Tex.

[73] Assignee: Motorola, Inc., Schaumburg, Ill.

[21] Appl. No.: 980,566

[22] Filed: Dec. 1, 1997

[51] Int. Cl.[6] ................ H03C 5/00; H03K 7/08; H03K 7/10; H04L 27/36
[52] U.S. Cl. ............ 332/109; 332/107; 332/108; 332/112; 375/238; 375/239
[58] Field of Search .................. 332/106–114; 327/173–175; 375/238, 239

[56] References Cited

U.S. PATENT DOCUMENTS

| | | | |
|---|---|---|---|
| 5,251,330 | 10/1993 | Chiba et al. | 455/91 |
| 5,295,158 | 3/1994 | Jordan | 575/22 |
| 5,481,230 | 1/1996 | Chang et al. | 332/112 |

OTHER PUBLICATIONS

An article entitled "Single–Sideband Transmission By Enveloped Elimination And Restoration", by Leonard R. Kahn, Member IRE, from Proceedings Of The I.R.E., 1952, pp. 803–806.

*Primary Examiner*—David Mis
*Attorney, Agent, or Firm*—Dana B. LeMoine

[57] ABSTRACT

A method and apparatus for generating a modulated signal include a pulse modulation source (215), a pulse modulator (20) for modulating a pulsed signal, a high efficiency power amplifier (230) for amplifying the modulated pulsed signal, and a harmonic reduction filter (240) for passing the switching frequency of the pulsed signal as the RF carrier. The pulse modulation source (215) accepts baseband inphase and quadrature signals and determines phase values and duty ratios for modulating the pulsed signal. The pulse modulator (20) phase modulates and duty cycle modulates the pulsed signal before it is amplified and filtered. A quadrature demodulator (260) produces baseband inphase and quadrature feedback signals for increased linearity.

24 Claims, 4 Drawing Sheets

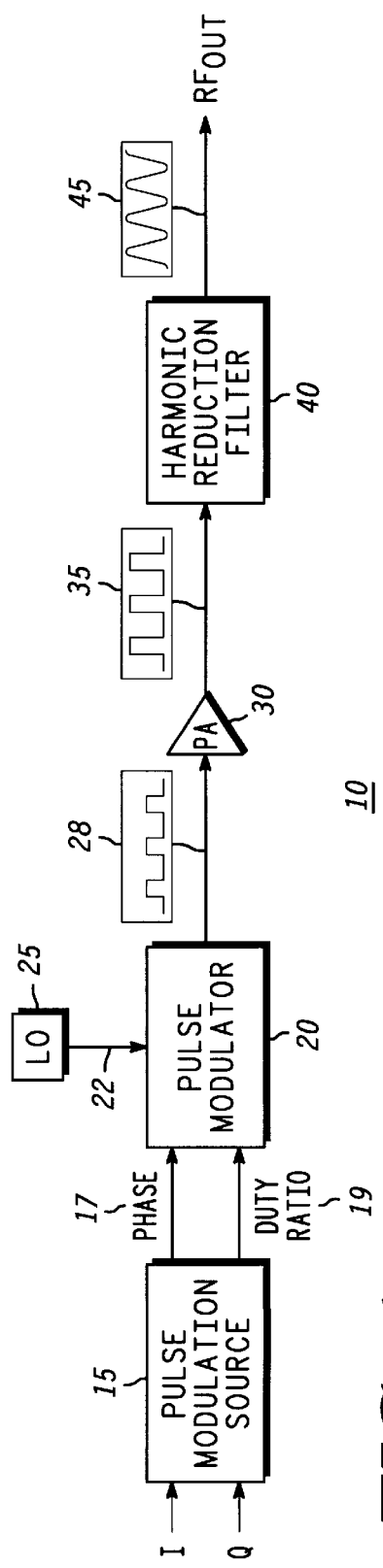
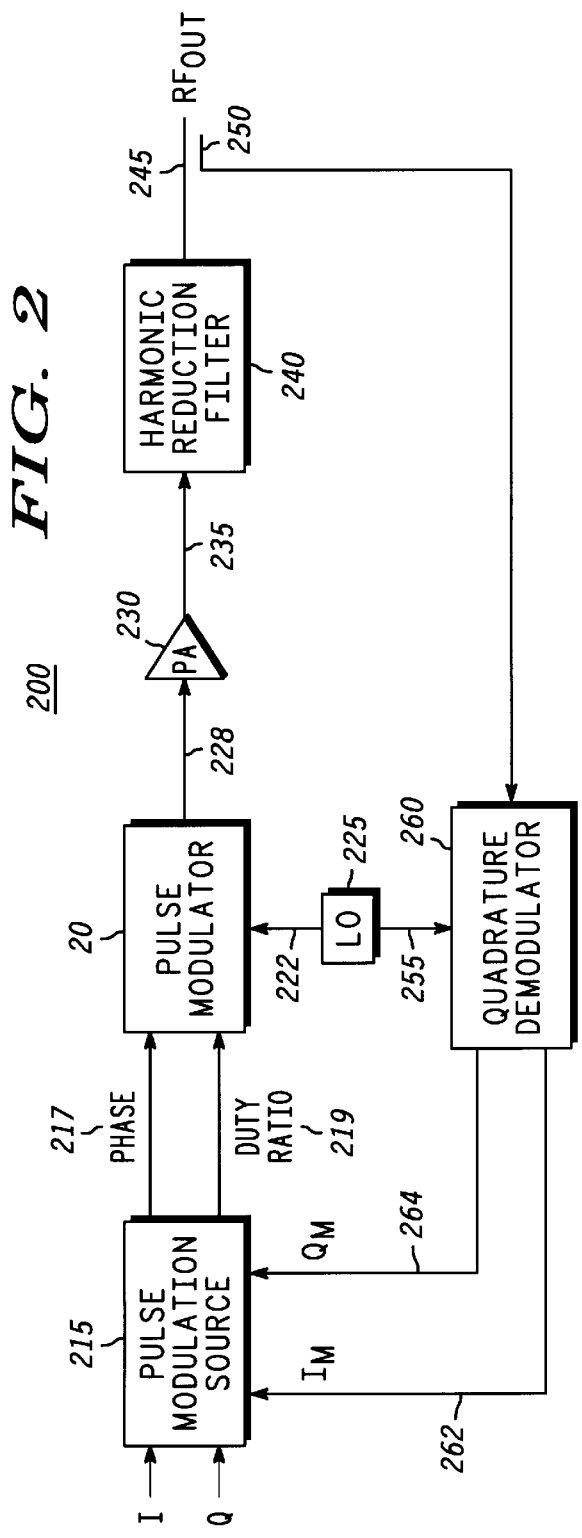

५,८३८,२१०

METHOD AND APPARATUS FOR GENERATING A MODULATED SIGNAL

METHOD AND APPARATUS FOR GENERATING A MODULATED SIGNAL

1. Field of the Invention

This invention relates in general to the generation of modulated signals from baseband signals and, in particular, to the efficient generation of wideband modulated signals from quadrature baseband signals.

2. Background of the Invention

Various apparatus are available for amplifying signals. In amplifier applications that involve the amplification and transmission of modulated signals, a premium is placed on amplifier efficiency. In addition, because many applications require a wide bandwidth, a premium is placed on the ability to efficiently create a high fidelity reproduction of a wideband signal.

Communications devices, which often transmit wideband signals, are an example of an application where these qualities are in demand. Low distortion allows the communications devices to communicate more reliably, and high efficiency allows the devices to operate longer on a single battery.

Wideband communications signals usually have correspondingly wide modulation bandwidths. That is, when a signal occupies a large radio frequency (RF) bandwidth, the envelope of the signal within that bandwidth is rapidly changing. An amplifier that efficiently amplifies a signal of this type preferably has a wide RF bandwidth and a wide modulation bandwidth.

In addition, it is desirable to efficiently amplify signals with large peaks and valleys in the envelope. In conventional linear power amplifiers, when amplifying signals with large peaks and valleys in the envelope, the power conversion efficiency is small. An efficient RF generator that can produce a desired amplitude and phase modulated signal would reduce power drain and transmitter complexity.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S modulator which operates on the bandwidth of the RF envelope rather than the RF bandwidth. The phase modulated carrier in the phase path is then amplitude modulated by the amplified envelope signal, creating an amplified replica of the input signal.

In EER-type amplifiers the modulation bandwidth is limited in part by the bandwidth of the class S modulator used to amplify the envelope. Because the switching frequency of the class S modulator is required to be much greater than the envelope bandwidth, large bandwidths require high switching frequencies, which tend to be less efficient.

Accordingly, a need exists for a power amplifier that efficiently amplifies a wideband RF signal exhibiting a wide modulation bandwidth. A need also exists for a power amplifier that efficiently amplifies signals that exhibit large peaks and valleys in the envelope.

BRIEF DESCRIPTION OF THE DRAWINGS

FIG. 1 shows a diagram of an apparatus for generating a modulated signal in accordance with a preferred embodiment of the present invention;

FIG. 2 shows a diagram of an apparatus with feedback for generating a modulated signal in accordance with a preferred embodiment of the present invention;

DETAILED DESCRIPTION OF THE DRAWINGS

Figure 3:
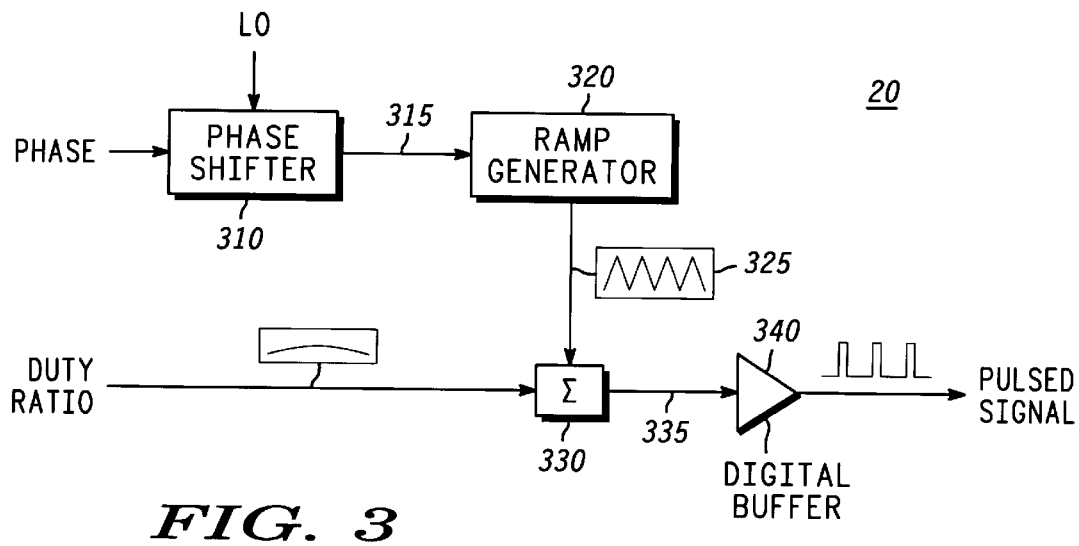
FIG. 3 shows a diagram of a pulse modulator in accordance with a preferred embodiment of the present invention.

Turning now to the drawings in which like reference characters indicate corresponding elements throughout the several views, attention is first directed to FIG. 1.

FIG. 1 shows a diagram of an apparatus for generating a modulated signal in accordance with a preferred embodiment of the present invention. Signal generator 10 includes pulse modulation source 15, pulse modulator 20, local oscillator 25, power amplifier 30, and harmonic reduction filter 40. Pulse modulation source 15 receives baseband in phase (I) and quadrature (Q) signals. Pulse modulation source 15 determines a phase value 17, and a duty ratio 19 which are sent to pulse modulator 20. Along with phase value 17 and duty ratio 19 from pulse modulation source 15, pulse modulator 20 receives pulsed local oscillator signal 22 from local oscillator 25.

Local oscillator signal 22 is a signal with a fundamental frequency equal to the desired final output frequency. Local oscillator signal 22 can be a sine wave signal with a single frequency component, or can be a pulsed signal with multiple frequency components.

Pulse modulator 20 shifts the phase of local oscillator signal 22 according to phase value 17, and also modifies the duty cycle of local oscillator signal 22 as a function of duty ratio 19. The resulting phase modulated and duty cycle modulated signal is output as pulsed signal 28. Because power amplifier 30 is amplifying a pulsed signal, linear amplification is not necessary and an efficient, saturating, non-linear amplifier may be employed. Power amplifier 30 produces amplified pulsed signal 35 which has a fundamental frequency equal to that of the desired output frequency, but also has spectral content at baseband and at harmonics of the fundamental frequency. Amplified pulsed signal 35 is input into harmonic reduction filter 40 which suppresses the spectral content above the desired output frequency, and outputs modulated signal 45 which is at the desired output frequency.

Signal generator 10 provides many advantages. Because the processing involves pulsed signals, signal generator 10 operates very efficiently. Individual components within signal generator 10 can operate in saturation, and therefore efficiently, because of the pulsed nature of the signals. In addition, signal generator 10 provides a simplified method for generating a modulated radio frequency (RF) signal directly from baseband signals.

Pulse modulation source 15 preferably operates on I and Q baseband data. I and Q baseband data can be either analog or digital, but is preferably digital. When I and Q baseband data are digital, pulse modulation source 15 is preferably a digital signal processor. Phase value 17 is determined by pulse modulation source 15 as shown in equation 1.

$$p = \text{Tan}^{-1}\left(\frac{Q}{I}\right) \qquad \text{Equation 1}$$

Equation 1 is recognizable as the arctangent of the ratio of the quadrature component to the inphase component. Phase value 17 as computed by equation 1 is equal to the phase of the baseband signal. Duty ratio 19 is determined by pulse modulation source 15 as shown in equation 2.

$$d = \frac{1}{\pi} \sin^{-1}\sqrt{I^2 + Q^2} \qquad \text{Equation 2}$$

As can be seen in equation 2, the duty ratio is not equal to the amplitude of the baseband signal. Instead, the duty ratio is proportional to the arcsin of the amplitude of the baseband signal. This is because in a pulsed system, the resulting amplitude is proportional to the sin of $\pi*d$, where d is the duty ratio. Equation 2 represents the above proportionality after having been solved for d. Equation 2 maximizes the duty ratio range from zero to one half. A duty ratio beyond one half results in a lower amplitude and is preferably avoided. It is also possible to define the mapping such that the maximum duty ratio does not occur at one half, but rather at some quantity substantially less than one half. This reduces the dynamic range of the duty ratio and increases the spectral energy at frequencies harmonically related to the desired output frequency. This mapping may be chosen to avoid the possibility of the duty ratio inadvertently exceeding one half.

The method and apparatus of the present invention is applicable to a variety of communications equipment that produces variable envelope RF signals. A high power RF signal having amplitude and phase modulation is produced with high linearity and power conversion efficiency. The RF signal is generated by modulating the phase and duty ratio of the pulsed signal within the signal generator. There are no explicit speed limitations on the phase and duty ratio of a pulse modulator. Thus wide bandwidth signals can be created and amplified by this technique. High linearity is achieved even with RF signals having fast moving envelopes.

The method and apparatus of the present invention is particularly advantageous for Code Division Multiple Access (CDMA) signals, multicarrier CDMA signals, and multicarrier Time Division Multiple Access (TDMA) signals where modulation bandwidths can be large. For example, modulation bandwidths in these systems can be, and often are, in excess of 1 Megahertz (Mhz). If a prior art class S modulator were to create the envelope signal in an EER-type amplifier, the switching frequency of the class S modulator would require a switching frequency in excess of a few tens of MHz. Class S modulators do not currently operate at these higher frequencies, and class S modulators that approach these frequencies are inefficient. The method and apparatus of the present invention, on the other hand, can easily and efficiently create the wideband RF signals necessary for multicarrier CDMA and multicarrier TDMA signals.

FIG. 2 shows a diagram of an apparatus with feedback for generating a modulated signal in accordance with a preferred embodiment of the present invention. Signal generator 200 as shown in FIG. 2 is much like signal generator 10 shown in FIG. 1 with the addition of a feedback loop. Signal generator 200 includes pulse modulation source 215, pulse modulator 20, power amplifier 230, harmonic reduction filter 240, coupler 250, local oscillator 225, and quadrature demodulator 260. Analogous to the operation of signal generator 10 (FIG. 1), pulse modulator 20 receives phase value 217 and duty ratio 219 for the purposes of modulating local oscillator signal 222.

Local oscillator signal 222 as generated by local oscillator 225 is a signal with a fundamental frequency equal to that of the desired output frequency. Pulse modulator 20 modulates local oscillator signal 222 and produces pulsed signal 228 to be amplified by power amplifier 230. Because power amplifier 230 is amplifying a pulsed signal, linear amplification is not necessary and an efficient, saturating, non-linear amplifier may be employed. Power amplifier 230 produces amplified pulsed signal 235 which has a fundamental frequency equal to that of the desired output frequency, but also has spectral content at baseband and at harmonics of the fundamental frequency. Harmonic reduction filter 240 receives amplified pulsed signal 235 and suppresses the spectral content at the harmonics of the desired output frequency. In an alternate embodiment harmonic reduction filter 240 also filters out baseband noise.

Coupler 250 samples the output signal and sends it to quadrature demodulator 260. Quadrature demodulator 260 also receives local oscillator signal 255 from local oscillator 225. Local oscillator signal 255, like local oscillator signal 222, is a signal with a fundamental frequency equal to the desired output frequency. Quadrature demodulator 260 utilizes circuitry and techniques well known in the art to demodulate the sampled output signal and produce baseband feedback signals $I_m$ 262 and $Q_m$ 264.

Pulse modulation source 215 has more information with which to produce phase value 217 and duty ratio 219, than does pulse modulation source 15 (FIG. 1). Whereas pulse modulation source 15 (FIG. 1) determines the phase and duty ratio from the baseband input signals, pulse modulation source 215 has information not only from the baseband input signals, but also from baseband versions of the output signal.

Pulse modulation source 215 determines duty ratio 219 as shown in equation 3.

$$d = \frac{1}{\pi} \sin^{-1}\sqrt{I^2 + Q^2} + a_0(I^2 + Q^2 - I_m^2 - Q_m^2) + \qquad \text{Equation 3}$$

$$a_1\!\int(I^2 + Q^2 - I_m^2 - Q_m^2)dt$$

The duty ratio as computed with feedback is the same as that computed without feedback, with the addition of a proportional error term and an integral error term. To limit the bandwidth of the feedback loop, the amplitude squared is used in determining the error terms, rather than the amplitude. This is advantageous because while the amplitude is generally not band limited, the square of the amplitude is generally band limited to twice the signal bandwidth. The terms $a_0$ and $a_1$ are constants.

Phase value 217 is determined in the same manner as phase value 17 (FIG. 1), with the addition of a proportional error term and an integral error term as shown in equation 4.

$$p = \text{Tan}^{-1}\left(\frac{Q}{I}\right) + b_0(QI_m - IQ_m) + b_1\!\int(QI_m - IQ_m)dt \qquad \text{Equation 4}$$

The error in the phase computed is a cross product of the desired constellation point (I, Q) and the error in tracking (I-$I_M$, Q-$Q_m$). The cross product is a measure of the angular error. This is chosen to be the error signal as it weights the error with a magnitude squared. The terms $b_0$ and $b_1$ are constants.

The feedback signal for the phase is chosen to limit the system bandwidth requirements. The feedback terms are products of the measured and ideal baseband signals. These are usually bandlimited and the resulting system does not require high loop bandwidth. Another feature of the phase error that improves the noise performance is that the error is related to the power of the error between the ideal and measured signals. In prior art systems the phase error is defined as the difference between actual phase and the measured phase, and is not proportional to the signal power. The prior art phase error term can be extremely large when the signal goes through a null, resulting in noise problems when the signal has nulls or even a large peak to null ratio. The feedback signal of the present invention is appropriately weighted in terms of the power and results in an optimal response in presence of noise.

Signal generator 200 has many advantages. The feedback loop removes non-linearities introduced by components within the circuit, and the band limited feedback produces a stable system.

FIG. 3 shows a diagram of a pulse modulator in accordance with a preferred embodiment of the present invention. Pulse modulator 20 includes phase shifter 310, ramp generator 320, signal summer 330, and digital buffer 340. Phase shifter 310 receives a phase value and receives a local oscillator signal which is a pulsed signal having a fundamental frequency equal to that of the desired output frequency. Phase shifter 310 shifts the phase of the LO signal by a phase amount determined from the phase value. The resulting signal is the phase shifted carrier 315. Ramp generator 320 receives signal 315 and generates ramp waveform 325. Ramp waveform 325 is then summed with the duty ratio by signal summer 330, thereby producing signal 335. Digital buffer 340 effects a voltage to time translation and the result is a phase and duty cycle modulated pulsed signal.

While a specific embodiment of pulse modulator 20 has been shown, many alternate embodiments exist and are meant to be within the scope of the present invention. For example, in a first alternate embodiment rather than the entire local oscillator signal being shifted, just the timing of the rising edge is controlled by the phase value. Then the time placement of the falling edge is determined by the duty ratio. In a second alternate embodiment, the timing of the falling edge is controlled by the phase value, and the timing of the rising edge is controlled by the duty ratio.

Another alternate embodiment is the "cycle skipping embodiment." To implement low amplitudes it is necessary to realize very low duty ratios. As duty ratios become very small, losses increase. To overcome this problem, the cycle skipping embodiment skips alternate cycles such that the inband amplitude is reduced. By skipping alternate cycles, the dynamic range is increased by 6 dB. Along with the dynamic range increase comes more unwanted spectral energy. Specifically, spurs occur at one-half and at three halves of the carrier frequency. In the cycle skipping embodiment the harmonic reduction filter suppresses these unwanted spurs.

It should be noted that pulse modulator 20 and its alternate embodiments differ from prior art pulsewidth modulators in that pulse modulator 20 enjoys two degrees of freedom rather than one. These two degrees of freedom, namely phase and duty ratio, are maintained through the output of the system because the fundamental frequency of the local oscillator signal is preserved. The RF carrier frequency is pulse modulated in both phased and duty ratio such that the phase and amplitude of the RF signal is intact. In a complex modulated RF signal there are two degrees of freedom, amplitude and phase. A pulsed signal also has two degrees of freedom. The pulse center and the pulsewidth (or the position of the rising edge and the falling edge). By making both of these positions variable, the method and apparatus of the present invention are able to produce a complex modulated RF signal from a pulsed signal.

Signal generator 200 (FIG. 2) has been simulated to demonstrate the desired operation. A two tone test was performed with the tones separated by two megahertz and centered at one gigahertz. The results are shown in the following two figures.

Figure 4:
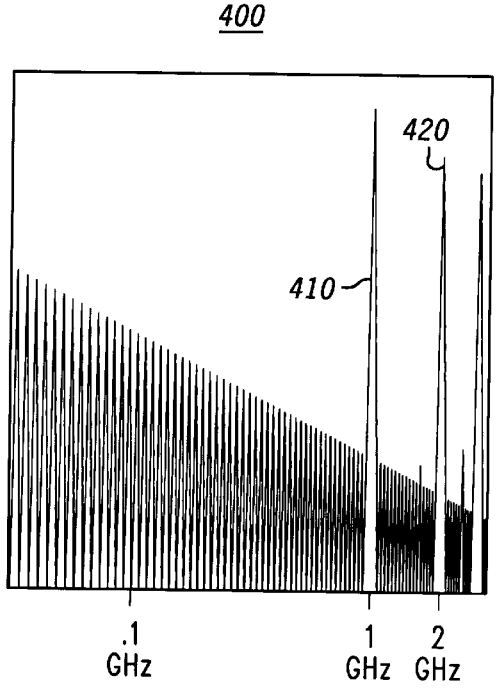
FIG. 4 shows a spectral plot of a pulse modulator output signal in accordance with a preferred embodiment of the present invention.

FIG. 4 shows a spectral plot of a pulse modulator output signal in accordance with a preferred embodiment of the present invention. Plot 400 shows the spectral content of pulsed signal 228 (FIG. 2) from roughly 10 megahertz (MHz) to more than three gigahertz (GHz). Signal 410 at one GHz is the signal desired at the output of signal generator 200 (FIG. 2). Signal 420 represents the second harmonic of signal 410. Signal 420 is not desirable at the output of signal generator 200 (FIG. 2). It is well known in the art however, that filters such as harmonic reduction filter 240 (FIG. 2) are readily available and effective at filtering out second and higher harmonics such as signal 420.

All amplifiers have nonlinearities associated with them, some smaller than others. There are even order and odd order nonlinearities. For an amplitude modulated RF signal passing through a power amplifier, the odd order nonlinearities result in spectral content in the immediate spectral vicinity of the desired signal. The method and apparatus of the present invention produces a signal that has extremely low spectral content in the immediate neighborhood and the higher spectral content at baseband and at multiples of the carrier frequency. As previously mentioned, these unwanted frequencies can be easily filtered. The signal emerging from the filter is more linear than the output of many power amplifiers.

Figure 5:
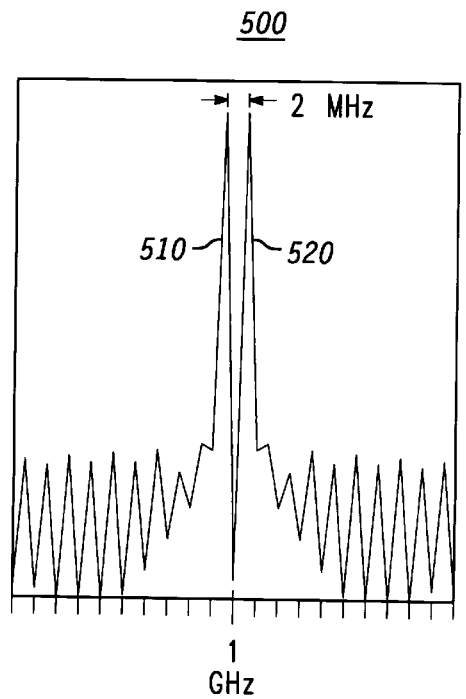
FIG. 5 shows a spectral plot of a pulse modulator output signal in accordance with a preferred embodiment of the present invention.

FIG. 5 shows a spectral plot of a pulse modulator output signal in accordance with a preferred embodiment of the present invention. Plot 500 shows the near band spectrum at one GHz. Because of the increased resolution, it can be seen that signal 410 (FIG. 4) is actually two signals separated by two MHz, signal 510 and signal 520. Signal 510 and signal 520 are two desirable signals that result from the two tone test of the simulation. Plot 500 also demonstrates that there is no unwanted spectral energy in the near spectrum that would cause a problem for a harmonic reduction filter. The adjacent channel performance shown in plot 500 demonstrates high linearity while maintaining high efficiency. This performance is achievable here for a signal that has high bandwidth and high peak to average ratio. These simulation results demonstrate that the method and apparatus of the present invention advantageously produce a high fidelity modulated signal.

Figure 6:
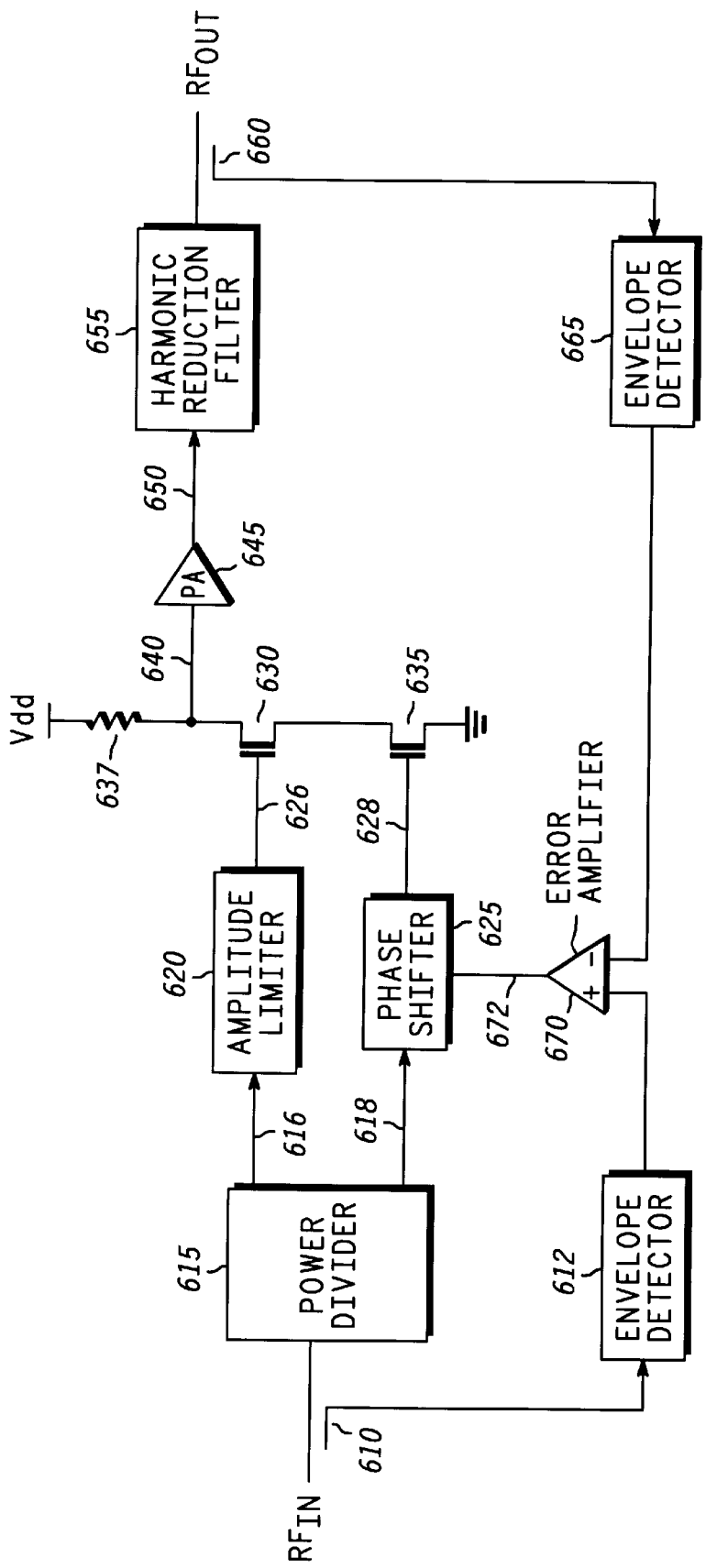
FIG. 6 shows a diagram of an analog implementation of a pulse modulated signal generator in accordance with an alternate embodiment of the present invention.

FIG. 6 shows a diagram of an analog implementation of a pulse modulated signal generator in accordance with an alternate embodiment of the present invention. Signal generator 600 includes power divider 615, amplitude limiter 620, phase shifter 625, transistors 630 and 635, resistor 637, and power amplifier 645. Signal generator 600 further includes harmonic reduction filter 655, couplers 610 and 660, envelope detectors 612 and 665, and error amplifier 670.

Signal generator 600 receives an RF input signal. The RF input signal feeds power divider 615 and coupler 610. Power divider 615 divides the RF input signal into two signals, signal 616 and signal 618. Signal 616 is amplitude limited by amplitude limiter 620. Amplitude limiter 620 can be omitted or can perform soft limiting, but preferably performs hard limiting so that output signal 626 is a phase modulated carrier with a substantially constant amplitude. Signal 618 drives phase shifter 625. Phase shifter 625 shifts the phase of signal 618 by an amount determined from signal 672. Phase shifter 625 can also perform soft limiting, but preferably performs hard limiting so that the output signal has a substantially constant amplitude. The generation of signal 672 is discussed further below.

Transistors 630 and 635 are driven by signals 626 and 628 respectively. Transistors 630 and 635 have an "anding" function in that signal 640 will have a duty cycle determined by the intersection of the "on" times of signal 626 and 628. As signal 628 is increasingly shifted in phase, the duty cycle of signal 640 is reduced. Signal 640 is a pulsed signal which feeds power amplifier 645, which in turn produces amplified pulsed signal 650. Harmonic reduction filter 655 operates in the same manner as harmonic reduction filter 240 (FIG. 2) to reduce unwanted spectral energy.

Coupler 610 and coupler 660 sample the RF input waveform and the RF output waveform respectively. Envelope detector 612 and envelope detector 665 detect the envelope of the RF input signal and the envelope of the RF output signal respectively. The RF input envelope and the RF output envelope are input to error amplifier 670 thereby producing error signal 672 which controls phase shifter 625. As previously stated, as phase shifter 625 increases the phase shift imposed on signal 628, the duty cycle of pulsed signal 640 decreases, thereby decreasing the amplitude of the RF output signal.

Signal generator 600 has many advantages associated with an analog implementation. The complexity is minimized and the system can be used in extremely wide band applications.

Figure 7:
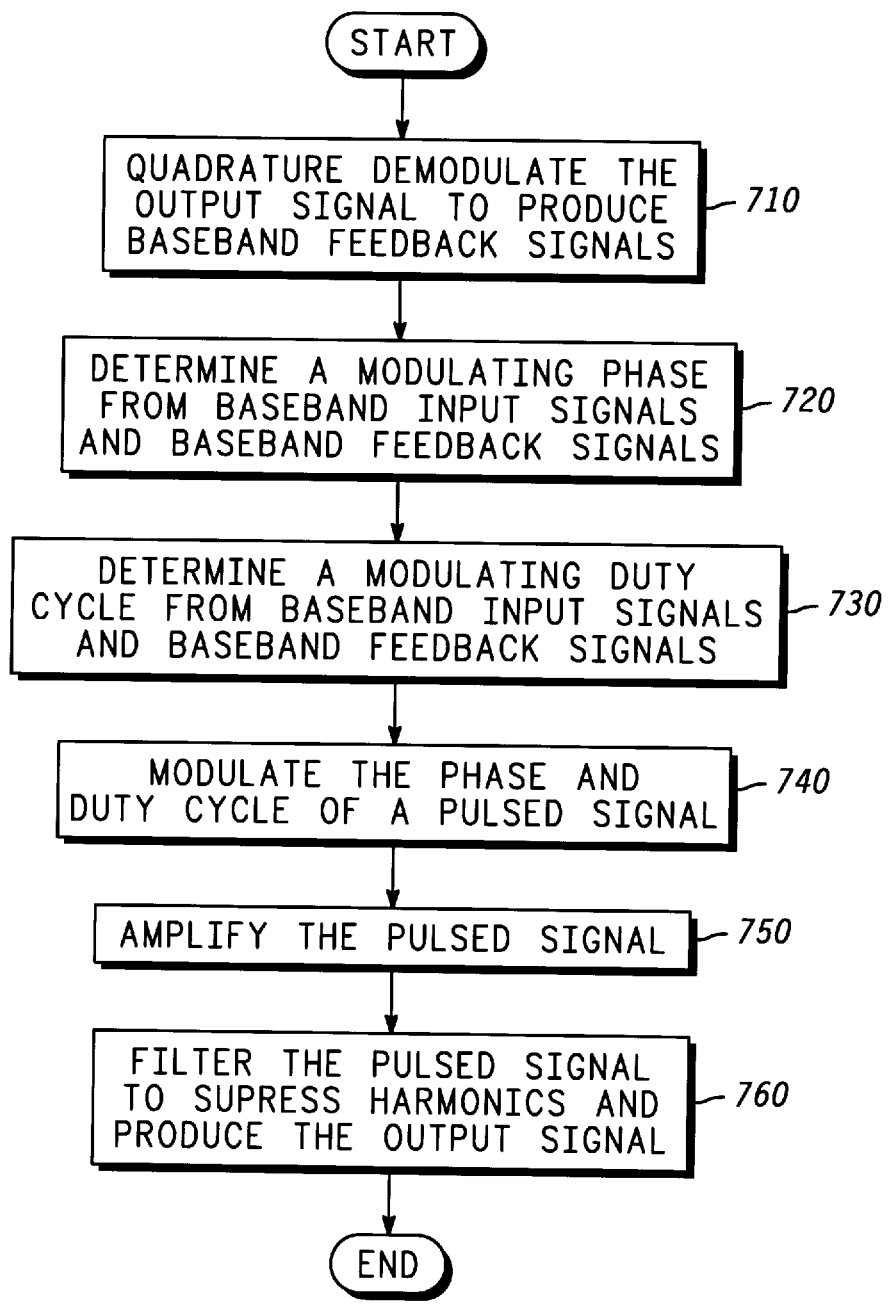
FIG. 7 shows a flow chart for a method of generating a modulated signal in accordance with a preferred embodiment of the present invention.

FIG. 7 shows a flow chart for a method of generating a modulated signal in accordance with a preferred embodiment of the present invention. Method 700 begins with step 710 when the desired output signal is quadrature demodulated to produce baseband feedback signals. These baseband feedback signals are preferably in phase and quadrature signals. In step 720 a modulating phase is determined from baseband input signals and from the baseband feedback signals generated in step 710. Analogous to the baseband feedback signals, the baseband input signals are preferably inphase and quadrature signals. In step 730, a modulating duty cycle is determined from the baseband input signals and the baseband feedback signals.

After having generated the modulating phase and the modulating duty cycle, a pulsed signal is modulated in phase and duty cycle in step 740. The result of step 740 is a phase and duty cycle modulated pulsed signal. Then in step 750 the modulated pulsed signal is amplified with an efficient amplifier. The amplified modulated pulsed signal that results from step 750 contains unwanted spectral energy at frequencies other than that of the desired output signal. In step 760 the amplified modulated pulsed signal is filtered to suppress unwanted spectral energy and to produce the output signal.

In summary, the method and apparatus of the present invention provides an advantageous means for generating a modulated waveform. A pulse modulated RF signal of constant envelope is generated that realizes an RF signal having the desired amplitude and phase modulation in the band of interest. Spectral content exists at multiples of the carrier frequency that are easily filtered and result in little power dissipation. It is easier and more efficient to change the duty ratio of a pulse signal with higher speed and lower losses than to generate a variable amplitude signal.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of producing a modulated signal, said method comprising the steps of:

determining a phase of a baseband signal;

determining an amplitude of said baseband signal;

phase modulating a pulsed signal as a function of said phase of said baseband signal to produce a phase modulated pulsed signal;

pulsewidth modulating said phase modulated pulsed signal as a function of said amplitude of said baseband signal to produce a pulsewidth modulated pulsed signal;

amplifying said pulsewidth modulated pulsed signal to produce an amplified signal; and filtering said amplified signal.

2. A method of producing a modulated signal, said method comprising the steps of:

modulating a phase of a pulsed signal to produce a phase modulated pulsed signal;

modulating a duty cycle of said phase modulated pulsed signal to produce a duty cycle modulated pulsed signal; and filtering said duty cycle modulated pulsed signal.

3. The method of claim 2 wherein said pulsed signal has a plurality of rising edges and a plurality of falling edges, and said phase modulating step comprises the step of time shifting said plurality of rising edges.

4. The method of claim 3 wherein a time between each of said plurality of rising edges and corresponding ones of said plurality of falling edges defines a pulsewidth, and said duty cycle modulating step comprises the step of changing said pulsewidth.

5. The method of claim 2 wherein said pulsed signal has a plurality of rising edges and a plurality of falling edges, and said phase modulating step comprises the step of time shifting said plurality of falling edges.

6. The method of claim 5 wherein a time between each of said plurality of rising edges and corresponding ones of said plurality of falling edges defines a pulsewidth, and said duty cycle modulating step comprises the step of changing said pulsewidth.

7. The method of claim 2 wherein said pulsed signal has a plurality of rising edge and falling edge pairs, and said phase modulating step comprises the step of time shifting said plurality of rising edge and falling edge pairs.

8. The method of claim 2 wherein said pulsed signal includes a carrier frequency and higher frequencies, and said filtering step comprises the step of suppressing said higher frequencies.

9. The method of claim 2 wherein prior to said phase modulating step, the method further comprises the steps of:

quadrature demodulating said modulated signal to produce a baseband inphase feedback signal and a baseband quadrature feedback signal;

determining a phase modulating value from a baseband inphase input signal, a baseband quadrature input signal, said baseband inphase feedback signal, and said baseband quadrature feedback signal; and determining a duty cycle modulating value from said baseband inphase input signal, said baseband quadrature input signal, said baseband inphase feedback signal, and said baseband quadrature feedback signal.

10. The method of claim 2 wherein said pulsed signal comprises a plurality of pulses, said method further comprising the step of prior to said step of filtering, removing certain ones of said plurality of pulses.

11. An apparatus for generating a modulated signal from an inphase input signal and a quadrature input signal, said apparatus comprising:

a pulse modulation source, responsive to said inphase input signal and said quadrature input signal, for determining a phase and a duty ratio;

a pulse modulator coupled to said pulse modulation source, wherein said pulse modulator phase modulates a pulsed signal as a function of said phase, and duty cycle modulates said pulsed signal as a function of said duty ratio; and a harmonic reduction filter coupled between said pulse modulator and an output of said apparatus.

12. The apparatus of claim 11 wherein said pulse modulation source is comprised of a digital signal processor.

13. The apparatus of claim 11 further comprising an amplifier coupled between said pulse modulator and said harmonic reduction filter.

14. The apparatus of claim 11 further comprising a quadrature demodulator coupled to said output of said apparatus, and wherein said pulse modulation source is further responsive to said quadrature demodulator.

15. An apparatus for generating a modulated signal, said apparatus comprising:

means for determining a phase modulating value from an input signal;

means for determining a duty ratio modulating value from said input signal;

means, responsive to said phase modulating value, for phase modulating a pulsed signal to produce a phase modulated pulsed signal;

means, responsive to said duty ratio modulating value, for duty cycle modulating said phase modulated pulsed signal to produce a duty cycle modulated pulsed signal; and filtering means for suppressing unwanted frequencies from said duty cycle modulated pulsed signal.

16. The apparatus of claim 15 further comprising feedback means for creating a baseband representation of said modulated signal, and wherein said means for determining a duty ratio modulating value is responsive to said baseband representation of said modulated signal.

17. The apparatus of claim 15 wherein said means for determining a duty ratio modulating value comprises a digital signal processor.

18. An apparatus comprising:

a power divider, coupled to an input of said apparatus, for splitting an input signal into a first signal and a second signal;

means, responsive to an amplitude of said input signal and an amplitude of an output signal, for phase shifting said second signal;

means for recombining said first signal and said second signal; and a harmonic reduction filter coupled between said recombining means and an output of said apparatus.

19. The apparatus of claim 18 further comprising an amplitude limiter for amplitude limiting said first signal.

20. The apparatus of claim 18 wherein said means for recombining comprises a plurality of transistors arranged to output a pulsed waveform having a duty cycle, said duty cycle being controlled in part by said means for phase shifting said second signal.

21. A communications device including an amplifier wherein said amplifier comprises:

a pulse modulation source, responsive to an inphase input signal and a quadrature input signal, for determining a phase and a duty ratio;

a pulse modulator coupled to said pulse modulation source, wherein said pulse modulator phase modulates a pulsed signal as a function of said phase, and duty cycle modulates said pulsed signal as a function of said duty ratio, resulting in a phase and duty cycle modulated signal; and a harmonic reduction filter coupled between said pulse modulator and an output of said amplifier for filtering said phase and duty cycle modulated signal.

22. The communications device of claim 21 wherein said pulse modulation source is comprised of a digital signal processor.

23. The communications device of claim 21 further comprising a power amplifier stage coupled between said pulse modulator and said harmonic reduction filter.

24. The communications device of claim 21 further comprising a quadrature demodulator coupled to said output of said amplifier, and wherein said pulse modulation source is further responsive to said quadrature demodulator.

* * * * *